(12) United States Patent
Satoh et al.

(10) Patent No.: US 9,029,824 B2
(45) Date of Patent: *May 12, 2015

(54) MEMORY DEVICE HAVING STITCHED ARRAYS OF 4 F² MEMORY CELLS

(71) Applicant: Avalanche Technology, Inc., Fremont, CA (US)

(72) Inventors: Kimihiro Satoh, Fremont, CA (US); Jing Zhang, Los Altos, CA (US); Yiming Huai, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/449,044

(22) Filed: Jul. 31, 2014

(65) Prior Publication Data

US 2014/0339626 A1    Nov. 20, 2014

Related U.S. Application Data

(63) Continuation of application No. 13/680,037, filed on Nov. 17, 2012, now Pat. No. 8,878,156.

(60) Provisional application No. 61/562,309, filed on Nov. 21, 2011.

(51) Int. Cl.
*H01L 45/00* (2006.01)
*H01L 29/78* (2006.01)
*H01L 27/24* (2006.01)
*H01L 27/115* (2006.01)

(52) U.S. Cl.
CPC ............ *H01L 45/1233* (2013.01); *H01L 45/06* (2013.01); *H01L 45/04* (2013.01); *H01L 29/7827* (2013.01); *H01L 27/11507* (2013.01); *H01L 45/08* (2013.01); *H01L 27/11514* (2013.01); *H01L 45/085* (2013.01); *H01L 45/144* (2013.01); *H01L 45/145* (2013.01); *H01L 27/2454* (2013.01); *H01L 27/2463* (2013.01); *H01L 27/2481* (2013.01)

(58) Field of Classification Search
CPC ..................... H01L 27/11507; H01L 29/7827; H01L 45/1233
USPC ........................................... 257/331, E27.091
See application file for complete search history.

(56) References Cited

U.S. PATENT DOCUMENTS 5,244,824 A    9/1993    Sivan
6,077,745 A    6/2000    Burns et al.
(Continued)

*Primary Examiner* — Joseph C Nicely
(74) *Attorney, Agent, or Firm* — Bing K. Yen

(57) ABSTRACT

A memory device comprises a semiconductor substrate having a plurality of parallel trenches therein, a memory region formed in the substrate including an array of memory cells having a plurality of vertical selection transistors with respective channels formed in trench sidewalls, a plurality of buried source electrodes in trench bottoms, a plurality of paired gate electrodes formed on paired trench sidewalls, a first and second stitch region disposed adjacent the memory region along a trench direction including a first and second row of gate contacts, respectively, and a row of source contacts disposed in the first or second stitch region with each of the source contacts coupled to a respective one of the source electrodes. One of each pair of the gate electrodes is coupled to a respective one of the first row of gate contacts and the other one of each pair of gate electrodes is coupled to a respective one of the second row of gate contacts.

10 Claims, 7 Drawing Sheets

(56) References Cited

U.S. PATENT DOCUMENTS

| | | |
|---|---|---|
| 6,114,725 A | 9/2000 | Furukawa et al. |
| 6,316,309 B1 | 11/2001 | Holmes et al. |
| 6,335,239 B1 | 1/2002 | Agahi |
| 6,350,635 B1 | 2/2002 | Noble et al. |
| 6,358,756 B1 | 3/2002 | Sandhu et al. |
| 6,399,979 B1 | 6/2002 | Noble et al. |
| 6,440,801 B1 | 8/2002 | Furukawa et al. |
| 6,449,186 B2 | 9/2002 | Noble |
| 6,498,065 B1 | 12/2002 | Forbes et al. |
| 6,504,201 B1 | 1/2003 | Noble et al. |
| 6,794,699 B2 | 9/2004 | Bissey et al. |
| 6,956,256 B2 | 10/2005 | Forbes |
| 7,382,647 B1 * | 6/2008 | Gopalakrishnan ............ 365/163 |
| 7,525,141 B1 | 4/2009 | Forbes |
| 7,777,264 B2 | 8/2010 | Voshell et al. |
| 7,859,026 B2 | 12/2010 | Ligon |
| 8,115,243 B2 | 2/2012 | Forbes |
| 8,537,631 B2 | 9/2013 | Chung |
| 8,575,584 B2 | 11/2013 | Satoh et al. |
| 8,609,523 B2 | 12/2013 | Forbes |
| 8,724,362 B2 * | 5/2014 | Kuo ................................ 365/63 |
| 8,878,156 B2 * | 11/2014 | Satoh et al. ........................ 257/3 |
| 2005/0265068 A1 * | 12/2005 | Takemura et al. ............ 365/149 |
| 2012/0248595 A1 * | 10/2012 | Or-Bach et al. ............... 257/706 |
| 2013/0088907 A1 * | 4/2013 | Kuo ................................ 365/63 |
| 2013/0126819 A1 | 5/2013 | Satoh et al. |
| 2014/0138609 A1 | 5/2014 | Satoh et al. |

* cited by examiner

MEMORY DEVICE HAVING STITCHED ARRAYS OF 4 F² MEMORY CELLS

RELATED APPLICATIONS

The present application is a continuation of the commonly assigned application bearing Ser. No. 13/680,037 filed Nov. 17, 2012, entitled "MEMORY DEVICE HAVING STITCHED ARRAYS OF 4 F² MEMORY CELLS," which claims the benefit of the provisional application bearing Ser. No. 61/562,309, filed Nov. 21, 2011.

FIELD OF THE INVENTION

The present invention relates to semiconductor memory architectures, particularly to memory devices having stitched arrays of memory cells.

BACKGROUND OF THE INVENTION

Resistive memory is a new class of non-volatile memory, which can retain the stored information when powered off. A resistive memory device normally comprises an array of memory cells, each of which includes at least a resistive memory element and a selection element coupled in series between appropriate electrodes. Upon application of an appropriate voltage or current to the resistive memory element, the electrical resistance of the resistive memory element would change accordingly, thereby switching the stored logic in the respective memory cell.

A resistive memory element can be classified into at least one of several known groups based on its resistively switching mechanism. The resistive memory element of Phase Change Random Access Memory (PCRAM) may comprise a phase change chalcogenide compound, which can switch between a resistive amorphous phase and a conductive crystalline phase. The resistive memory element of Conductive Bridging Random Access Memory (CBRAM) relies on the statistical bridging of metal rich precipitates therein for its switching mechanism. The resistive memory element of CBRAM normally comprises a nominally insulating metal oxide material, which can switch to a lower electrical resistance state as the metal rich precipitates grow and link to form conductive paths upon application of an appropriate voltage. The resistive memory element of Magnetoresistive Random Access Memory (MRAM) typically comprises at least two layers of different ferromagnetic materials with a non-magnetic spacer layer interposed therebetween. When a switching pulse is applied to the memory element of a MRAM device, one of the ferromagnetic layers will switch its magnetic field polarity, thereby changing the element's electrical resistance.

A selection element in a memory cell functions like a switch to direct current through the selected memory element coupled thereto. One common selection element is diode, which can reverse bias a non-selected memory cell. While a selection diode has a simple structure that can minimize the cell size of the resistive memory cell, a memory architecture employing the selection diode normally has a slower random access time. Another commonly used selection element is transistor, which allows for faster selection of memory cells and therefore faster random access time. While a memory device employing the selection transistor is more suitable for the random access type of memories, the more complicated structure of the selection transistor means the size of the memory cell will be larger, which translates to a lower cell density. Moreover, the memory device utilizing the selection transistor needs additional wiring for controlling the gate electrode, further complicating the scaling of the device.

To be cost competitive, a small memory cell size is desired in order to increase device density. One way to achieve this is to simply shrink the feature size, F, normally associated with a particular lithography process. However, several difficulties can arise when scaling down a conventional transistor, particularly its channel length, to sizes of a few tens of nanometers. As the channel length is reduced, there is a propensity for the formation of parasitic conduction paths between source and drain, thereby causing punch through current leakages. Another obstacle encountered in shrinking the conventional transistor is reduced current drivability caused by the reduced width of the current carrying channel. This is a significant issue for resistive memory devices, which require higher current to switch their memory state.

Another approach to reduce the memory cell size is to use a different architecture that would permit the memory cell size to scale down while increasing the channel width and length to mitigate the above mentioned problems associated with shrinking feature size. With the source, drain, and channel of the conventional selection transistor lie on a same plane, the conventional resistive memory cell size is limited to 8 F². As would be understood by one of ordinary skill in the art, the minimum pitch between two repetitive features on a same mask layer is 2 F. Accordingly, the minimum size of a memory cell would be 4 F² when arranged in a square array using conventional lithography.

To attain a cell size of 4 F² would require the channel of the selection transistor to be placed in such a way that allows the current to flow in a vertical direction perpendicular to the substrate plane. FIG. 1 illustrates a memory device having an array of 4 F² memory cells 80, each of which comprising a memory element 82 connected to a vertical selection transistor 84 by way of a contact stud 86. The vertical selection transistor 84 includes a drain region 88 disposed on top of a trench sidewall, a shared source region 90 disposed on the trench bottom, and a gate 92 formed on the trench sidewall, enabling current to flow vertically between the shared source 90 and drain region 88 by way of a vertical channel formed on the sidewall. It should be noted that while the memory cells 80 in FIG. 1 can be arranged to have a size of 4 F², the design and placement of gate, source, and bit electrodes connected to the cells is critical in preserving this minimum memory cell size for memory devices wherein multiple electrodes pass through each memory cell. Moreover, local gate, source, and bit electrodes coupled to an array of memory cells need to be connected to main wiring lines, such as word lines, bit lines, and source lines. For the 4 F² memory array illustrated in FIG. 1 wherein each cell has a cross section dimension of 2 F to accommodate a gate electrode and a source electrode in a same direction, it remains a challenge to construct the connections between the local electrodes and the main wiring lines such that both layout complexity and space usage are minimized.

SUMMARY OF THE INVENTION

The present invention provides a stitching architecture for connecting local electrodes of memory arrays having 4 F² memory cells to main device wiring lines while minimizing both layout complexity and space usage.

Accordingly, an object of the present invention is to provide a novel resistive memory device having a memory region and corresponding stitch regions.

Another object of the present invention is to provide a novel resistive memory device having stitched arrays of 4 $F^2$ memory cells connected to device word lines and source lines.

Therefore, according to one aspect of the present invention, a memory device comprises a semiconductor substrate having a plurality of parallel trenches therein, each of the trenches having a respective one of a plurality of trench bottoms and a respective pair of a plurality of paired trench sidewalls; a memory region formed in the semiconductor substrate including an array of memory cells having a plurality of vertical selection transistors with respective channels formed in the trench sidewalls; a plurality of buried source electrodes in the trench bottoms coupled to the memory cells along a first direction substantially parallel to the trenches; a plurality of parallel bit lines coupled to the memory cells along a second direction substantially orthogonal to the first direction; a plurality of paired gate electrodes formed on the paired trench sidewalls, the gate electrodes coupled to the memory cells along the first direction; a first and a second stitch region disposed adjacent the memory region along the first direction including a first and a second row of gate contacts formed in the trenches along the second direction, respectively; and a row of source contacts disposed in the trenches in the first or the second stitch region, each of the source contacts coupled to a respective one of the buried source electrodes, wherein one of each pair of the gate electrodes formed on a respective pair of the trench sidewalls is coupled to a respective one of the first row of gate contacts disposed in a respective one of the trenches and the other one of each pair of the gate electrodes is coupled to a respective one of the second row of gate contacts disposed in the respective one of the trenches.

According to another aspect of the present invention, a memory device comprises a plurality of memory arrays formed in a semiconductor substrate along a first direction with each of the memory arrays including a memory region comprising an array of memory cells arranged in a square array with a pitch of 2 F in a second direction substantially perpendicular to the first direction, a first and a second stitch region disposed adjacent the memory region along the first direction having a first and second row of gate contacts disposed therein, respectively, the first and second row of gate contacts being arranged along the second direction with a pitch of 4 F, each of the first and second row of gate contacts being connected to a respective row of the memory cells along the first direction, and a row of source contacts arranged along the second direction with a pitch of 4 F in the first or second stitch region, each of the row of source contacts being connected to two respective rows of the memory cells along the first direction; a first and second plurality of word lines extending along the first direction; and a plurality of source lines extending along the first direction, wherein each row of the first and second row of gate contacts of each of the memory arrays are coupled to the first or second plurality of word lines, and the row of source contacts of each of the memory arrays are coupled to the plurality of source lines.

According to yet another aspect of the present invention, a memory device comprises a semiconductor substrate having a plurality of parallel trenches therein, each of the trenches having a respective one of a plurality of trench bottoms and a respective pair of a plurality of paired trench sidewalls; a plurality of memory arrays formed in the semiconductor substrate, each of the memory arrays including a memory region comprising an array of memory cells having a plurality of vertical selection transistors with respective channels formed in the trench sidewalls, a plurality of buried source electrodes in the trench bottoms coupled to the memory cells along a first direction substantially parallel to the trenches, a plurality of parallel bit lines coupled to the memory cells along a second direction substantially orthogonal to the first direction, a plurality of paired gate electrodes on the paired trench sidewalls coupled to the memory cells along the first direction, a first and a second stitch region disposed adjacent the memory region along the first direction including a first and a second row of gate contacts formed in the trenches along the second direction, respectively, and a row of source contacts disposed in the trenches in the first or the second stitch region with each of the source contacts coupled to a respective one of the buried source electrodes, wherein one of each pair of the gate electrodes formed on a respective pair of the trench sidewalls is coupled to a respective one of the first row of gate contacts disposed in a respective one of the trenches and the other one of each pair of the gate electrodes is coupled to a respective one of the second row of gate contacts disposed in the respective one of the trenches, and each of the trenches has a respective one of the first row of gate contacts, a respective one of the second row of gate contacts, and a respective one of the source contacts disposed therein; a plurality of parallel source lines coupled to the source contacts of the memory arrays along the first direction; and a first and a second plurality of parallel word lines coupled to the gate contacts of the memory arrays along the first direction, wherein one of each pair of the gate electrodes formed on a respective pair of the trench sidewalls is connected to a respective one of the first plurality of word lines and the other one of each pair of the gate electrodes is connected to a respective one of the second plurality of word lines.

The objects, features, aspects, and advantages of the present invention are readily apparent from the following detailed description of the preferred embodiments for carrying out the invention when taken in connection with the accompanying drawings.

BRIEF DESCRIPTION OF THE DRAWINGS

For purposes of clarity and brevity, like elements and components will bear the same designations and numbering throughout the Figures, which are not necessarily drawn to scale.

DETAILED DESCRIPTION OF THE INVENTION

The present invention provides memory devices having 4 $F^2$ memory cells, including means for connecting arrays of memory cells to main wiring lines and to each other.

Figure 1:
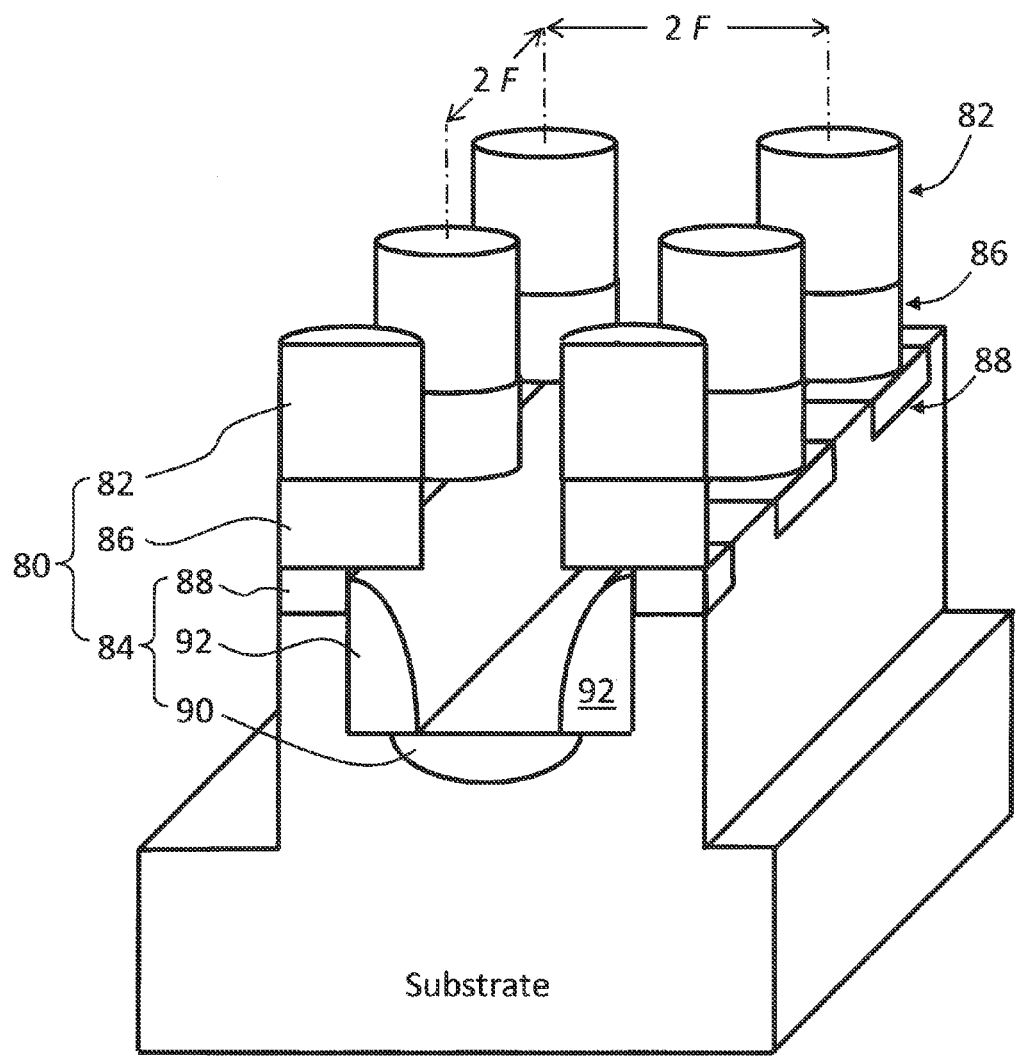
FIG. 1 is a perspective view illustrating an array of 4 $F^2$ memory cells, each of which comprising a memory element connected to a vertical selection transistor by way of a contact stud.
Figure 2:
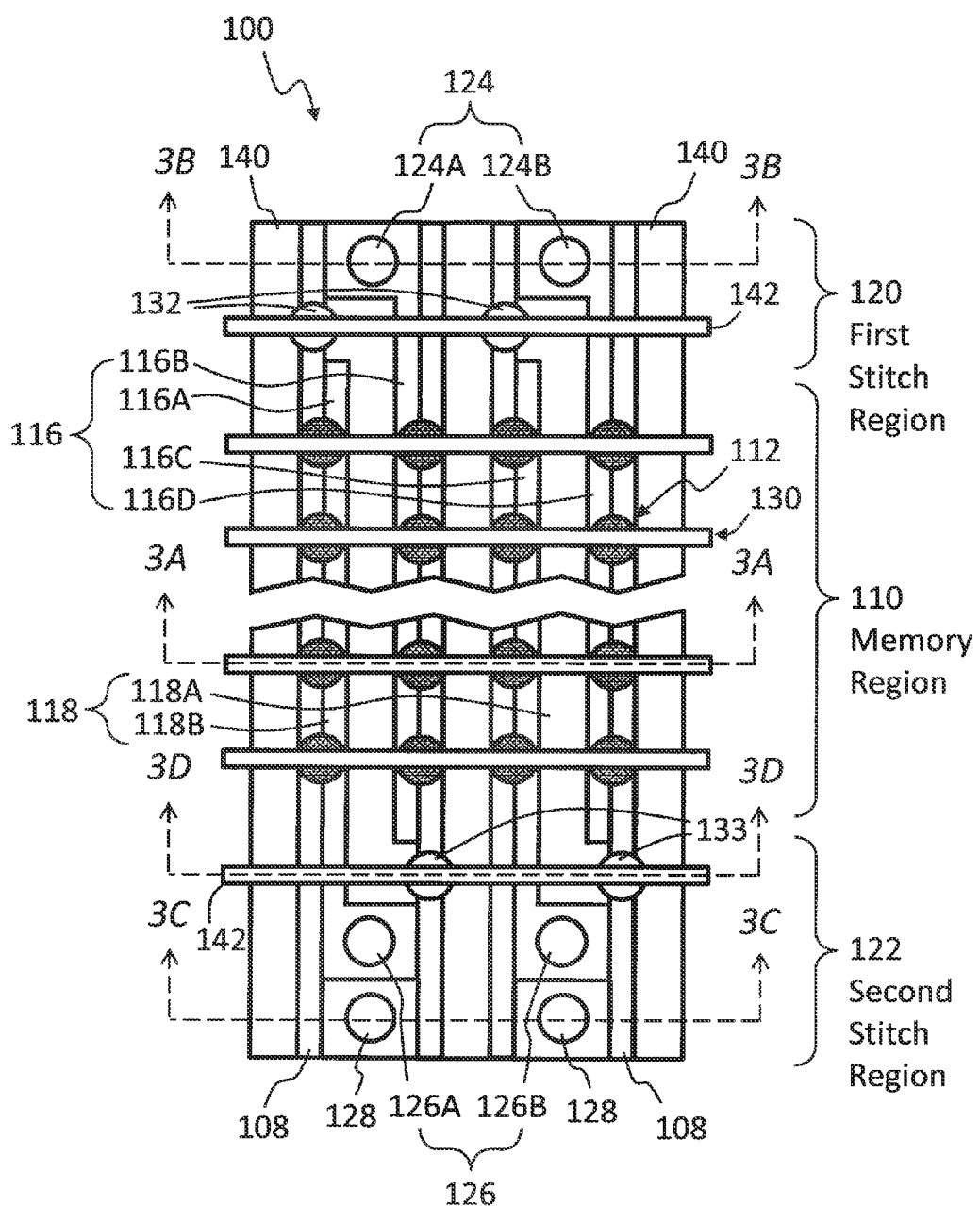
FIG. 2 is a top view of the present invention as applied to a memory device having a first and a second stitch region and a memory region including an array of 4 $F^2$ memory cells.

An embodiment of the present invention as applied to a memory device having an array of 4 $F^2$ memory cells will now be described with reference to FIG. 2 and FIGS. 3A-3D. FIG. 2 is a top view and FIGS. 3A-3D are corresponding cross sectional views of a memory array 100. In these drawings the insulation material separating various elements is omitted for reasons of clarity. With continuing reference to FIG. 2 and FIGS. 3A-3D, the illustrated memory array 100 comprises a semiconductor substrate 102 having a plurality of parallel trenches 104 therein, each of the trenches having a respective one of a plurality of trench bottoms 106 and a respective pair of a plurality of paired trench sidewalls 108; a memory region 110 formed in the semiconductor substrate 102 including an array of memory cells 112 having a plurality of vertical selection transistors 114 with respective channels formed in the trench sidewalls 108 (FIG. 3A); a plurality of paired gate electrodes 116 disposed on the trench sidewalls 108 and coupled to the memory cells 112 along a first direction parallel to the trenches 104; a plurality of buried source electrodes 118 formed in the trench bottoms 106 and coupled to the memory cells 112 along the first direction; a plurality of parallel bit lines 130 coupled to the memory cells 112 in a second direction substantially orthogonal to the first direction; a first stitch region 120 and a second stitch region 122 disposed adjacent the memory region 110 along the first direction including a first row of gate contacts 124 and a second row of gate contacts 126, respectively, formed in the trenches 104 along the second direction; a row of source contacts 128 disposed in the trenches 104 along the second direction in the first stitch region 120 or the second stitch region 122, wherein each of the source contacts 128 is coupled to a respective one of the buried source electrodes 118. One of each pair of the gate electrodes 116 formed on a respective pair of the trench sidewalls 108 is coupled to a respective one of the first row of gate contacts 124 disposed in a respective one of the trenches 104 and the other one of each pair of the gate electrodes 116 is coupled to a respective one of the second row of gate contacts 126 disposed in the respective one of the trenches 104. Each of the trenches 104 in the memory array 100 has a respective one of the first row of gate contacts 124, a respective one of the second row of gate contacts 126, and a respective one of the source contacts 128 disposed therein. The memory array 100 may also include a first plurality of substrate contacts 132 and a second plurality of substrate contacts 133 coupled to the substrate 102 for grounding or controlling the electrical potential thereof in the first stitch region 120 and the second stitch region 122, respectively. A plurality of parallel substrate lines 142 are coupled to the substrate contacts 132 and 133 in the second direction substantially orthogonal to the first direction.

In one embodiment, the memory cells 112 in the memory region 110 are arranged in a square array with a pitch of 2 F in the first and second direction, resulting in a cell size of 4 $F^2$. Accordingly, the source contacts 128 and the gate contacts 124 and 126 are arranged to have a pitch of 4 F in the second direction. Although only some exemplary rows of memory cells are shown in FIG. 2, it should be understood that the memory array 100 may have as many rows of memory cells in the first and second direction as needed.

Figure 3A:
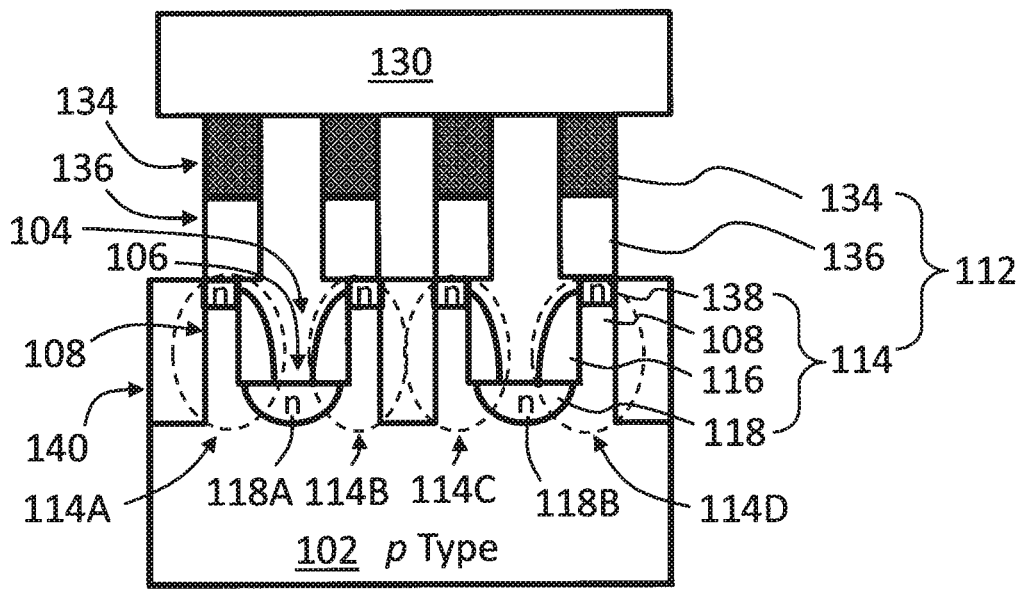
FIGS. 3A-3D are various cross sectional views corresponding to the memory device illustrated in FIG. 2.

Referring now to FIG. 3A, which shows the cross sectional view of the memory cells 112. Each of the memory cells 112 comprises a respective one of a plurality of memory elements 134 coupled to a respective one of the vertical selection transistors 114 by way of a respective one of the contact studs 136. Each of the vertical selection transistors 114 includes a respective one of a plurality of drain regions 138 formed on top of a respective one of the trench sidewalls 108 and a vertical channel formed in the respective one of the trench sidewalls 108 adjacent a respective one of the gate electrodes 116 with a thin gate dielectric layer (not shown) interposed therebetween. Each of the buried source electrodes 118 acts as a common source coupled to a respective pair of the transistors 114 formed on a respective pair of the trench sidewalls 108, that is source electrode 118A is coupled to transistors 114A/114B and source electrode 118B is coupled to transistors 114C/114D. When an appropriate potential is applied to one of the gate electrodes 116, charge carriers flows vertically from a respective one of the source electrodes 118 to a respective one of the drain regions 138 by way of a respective channel formed in a respective one of the sidewalls 108. The conducting channel may be unique to a respective one of the transistors 114 or may be shared by a respective row of the transistors 114 disposed on a respective one of the trench sidewalls 108 as disclosed in U.S. patent application Ser. No. 13/438,845. Each of the parallel bit lines 130 is coupled to a respective row of the memory elements 134 along the second direction. The parallel trenches 104 are separated by a plurality of trench isolation regions 140. It should be noted that the gate electrodes 116 are separated from the buried source electrodes 118 by the thin gate dielectric layer covering the trench bottoms 106 and the trench sidewalls 108.

The substrate 102 can be any p-type semiconductor substrate known in the art, such as silicon (Si), silicon germanium (SiGe), silicon carbide (SiC), SiCGe, II-VI compounds, III-V compounds, or semiconducting epitaxial layers over such substrates, thereby forming the selection transistors 114 with a n-type channel. In one embodiment, the semiconductor substrate 102 comprises silicon. Each of the parallel trenches 104, which may be formed by etching into the substrate 102, has a respective one of the trench bottoms 106 and a respective pair of the paired trench sidewalls 108. The buried source electrodes 118 having the n-type conductivity may be formed by ion implantation into the trench bottoms 106 with any suitable dopant, such as phosphorous, arsenic, or antimony. The drain regions 138 having the n-type conductivity are formed by ion implantation into top portion of the trench sidewalls 108 with any suitable dopant, such as phosphorous, arsenic, or antimony. The bottom of the drain regions 138 is preferably positioned below top of the gate electrodes 116. The gate dielectric layer lining the trench sidewalls 108 preferably has a thickness of between 0.5-5 nm and may comprise any material with sufficiently high dielectric constant, including but not limited to $SiO_x$, $SiO_xN_y$, hafnium oxide ($HfO_x$), hafnium oxynitride ($HfO_xN_y$), hafnium silicate ($HfSiO_x$), $HfSiO_xN_y$, zirconium oxide ($ZrO_x$), zirconium oxynitride ($ZrO_xN_y$), zirconium silicate ($ZrSiO_x$), $ZrSiO_xN_y$, aluminum oxide ($AlO_x$), or combinations thereof. The gate dielectric layer may also be formed by thermal oxidation of the trench sidewalls 108 or by any suitable thin film deposition method, such as CVD or ALD.

The gate electrodes 116 are formed on the trench sidewalls 108 with the gate dielectric layer interposed therebetween. The height of the gate electrodes 116, which defines the length of the channels, is lower than the height of the trench sidewalls 108. When an appropriate voltage is applied to one of the gate electrodes 116, an electric field is induced across the gate dielectric layer to modulate the conductance of a respective channel formed in a respective one of the vertical trench sidewalls 108, thereby allowing charge carriers to move vertically between a respective one of the source electrodes 118 and a respective one of the drain regions 138. The gate electrodes 116 may be formed by first depositing one or more layers of conductors on the trench sidewalls 108 using a conformal thin film deposition method, such as Chemical Vapor Deposition (CVD) or Atomic Layer Deposition (ALD), and followed by Reactive Ion Etching (RIE) to define the electrode height. The gate electrodes 116 may comprise one or more layers of any suitable conductive material, such as doped polysilicon, tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), or combinations thereof.

A function of the contact studs 136 is to provide Ohmic contact for the drain regions 138 of the vertical selection transistors 114, thereby decreasing the contact resistance. Each of the contact studs 136 is disposed on top of a respective one of the drain regions 136. The contact studs 136 may comprise one or more layers of any suitable conductive material, such as tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), titanium (Ti), palladium (Pd), platinum silicide (PtSi), Indium (In), or combinations thereof. The contact studs 136 may be formed by depositing any suitable conductive material by ALD or CVD into previously formed contact holes and followed by Chemical Mechanical Polishing (CMP) to remove excess material.

Each of the memory elements 134 is disposed on top of a respective one of the contact studs 136. The memory elements 134 may switch their resistance state by any suitable switching mechanism, such as phase change, precipitate bridging, magnetoresistive switching, or combinations thereof. In one embodiment, the resistive memory elements 134 comprise a phase change chalcogenide compound, such as $Ge_2Sb_2Te_5$ or AgInSbTe, which can switch between a resistive amorphous phase and a conductive crystalline phase. In another embodiment, the resistive memory elements 134 comprise a nominally insulating metal oxide material, such as NiO, $TiO_2$, or $Sr(Zr)TiO_3$, which can switch to a lower electrical resistance state as the metal rich precipitates grow and link to form conductive paths upon application of an appropriate voltage. In yet another embodiment, the resistive memory elements 134 comprise at least two layers of ferromagnetic materials with a non-magnetic spacer layer interposed therebetween. When a switching pulse is applied, one of the ferromagnetic layers will switch its magnetic field polarity, thereby changing the element's electrical resistance.

The fabrication method for the memory region 110, including the memory cells 112, the gate electrodes 116, and the buried source electrodes 118, has been disclosed in U.S. patent application Ser. No. 13/438,845, which is incorporated herein by reference. In short, the method comprises the steps of providing a semiconductor substrate having the p-type conductivity and a pad layer thereon; forming a plurality of parallel trench isolation regions through the pad layer in the substrate; removing the pad layer to partially expose the parallel trench isolation regions; forming a hard mask self-aligned to the parallel trench isolation regions; forming a plurality of parallel trenches in between the trench isolation regions by selectively etching the substrate having the hard mask thereon, each of the trenches having a respective one of a plurality of trench bottoms and a respective pair of a plurality of trench sidewalls; conformally forming a gate dielectric layer over the trenches; forming a plurality of gate electrodes on the trench sidewalls with the gate dielectric interposed therebetween; forming a plurality of n-type parallel source electrodes in the trench bottoms by ion implantation; forming an interlayer dielectric layer by filling and covering the trenches; forming a plurality of contact holes through the interlayer dielectric layer with the contact holes being aligned to top of the trench sidewalls; forming a plurality of n-type drain regions in the trench sidewalls by ion implantation through the contact holes; forming a plurality of contact studs on the drain regions by filling the contact holes with a conductive material; forming a plurality of resistive memory elements on the contact studs; and forming a plurality of parallel bit lines coupled to respective rows of the memory elements along a direction perpendicular to the source electrodes.

Figure 3B:
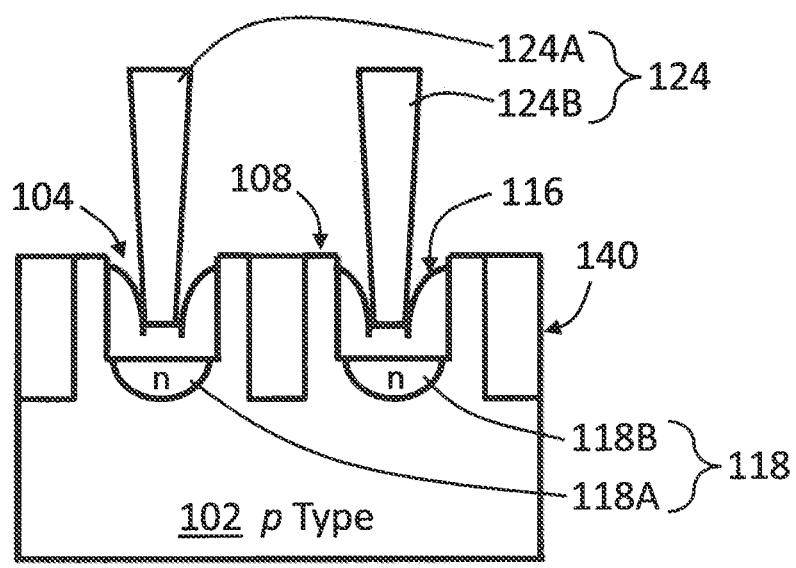

Referring now to FIG. 3B, which shows the cross sectional view of the first row of gate contacts 124 in the first stitch region 120. The gate contacts 124 are disposed in the trenches 104 and are coupled to the gate electrodes 116. It should be noted that the paired gate electrodes 116 on the trench sidewalls 108 are connected at the trench bottoms 106 here to enhance physical and electrical contact between the gate electrodes 116 and the gate contacts 124. The bottoms of the gate electrodes 116 are left intact by masking the gate contact regions during the etching process to form the paired gate electrodes 116 in the memory region 110 (FIG. 2B). While the current cross sectional view shows each of the gate contacts 124 is coupled to a respective pair of the gate electrodes 116 in the first stitch region 120, the top view in FIG. 2 shows that one of the respective pair of the gate electrodes 116 is severed near the gate contact region during processing. Therefore, each of the gate contacts 124 is coupled to one of a respective pair of the gate electrodes 116, that is gate contacts 124A and 124B are coupled to gate electrodes 116B and 116D, respectively. Gate electrodes 116A and 116C severed from the first stitch region 120 are coupled to gate contacts 126A and 126B disposed in the second stitch region 122, respectively. The second row of gate contacts 126 disposed in the second stitch region 122 have the same structure as the first row of gate contacts 124 illustrated in FIG. 3B. With continuing reference to FIG. 2, which shows a left electrode of a pair of the gate electrodes 116 is couple to a respective one of the gate contacts 126 in the second stitch region 122 while a right electrode of the pair of the gate electrodes 116 is couple to a respective one of the gate contacts 124 in the second stitch region 120, that is gate electrodes 116A and 116B are coupled to gate contacts 126A and 124A, respectively. However, this connection order can be reversed for one or more pair of the gate electrodes 116, that is gate electrodes 116A and 116B are coupled to gate contacts 124A and 126A, respectively, without altering operation of the memory array 100.

The gate contacts 124 and 126 may comprise any suitable conductive material, such as tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), titanium (Ti), palladium (Pd), platinum silicide (PtSi), Indium (In), or combinations thereof. The gate contacts 124 and 126 may be fabricated using a conventional damascene process in a manner as well known to one of skill in the art after the formation of the memory elements 134 or the source lines 118.

Figure 3C:
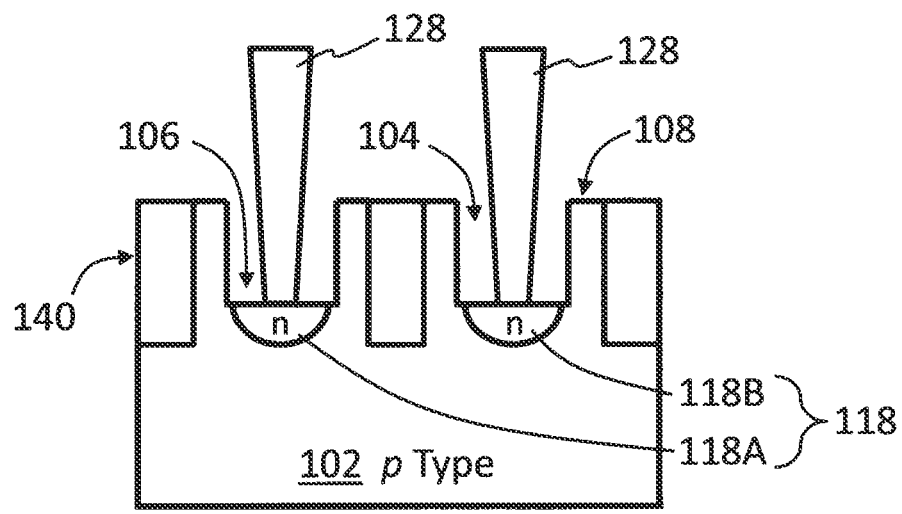

FIG. 3C illustrates the cross sectional view of the source contacts 128 in the second stitch region 122. The source contacts 128 are disposed in the trench bottoms 106 and are coupled to the buried source electrodes 118 without the gate dielectric layer interposed therebetween. The formation of the gate electrodes may be prevented by masking the source contact region during the gate electrode film deposition or by subsequent removal of deposited gate electrode film. It should be recognized that the source contacts 128 may be disposed in the first stitch region 120 or the second stitch region 122 without altering operation of the memory array 100. The source contacts 128 may comprise any suitable conductive material, such as tungsten silicide (WSi$_x$), titanium silicide (TiSi$_x$), cobalt silicide (CoSi$_x$), nickel silicide (NiSi$_x$), tantalum nitride (TaN$_x$), titanium nitride (TiN$_x$), tantalum (Ta), tungsten (W), titanium (Ti), palladium (Pd), platinum silicide (PtSi), Indium (In), or combinations thereof. The source contacts 128 may be fabricated using a conventional damascene process in a manner as well known to one of skill in the art after the formation of the memory elements 134 or the source lines 118. The gate dielectric layer covering the trench bottoms 106 is removed during the contact hole formation step of the damascene process.

Figure 3D:
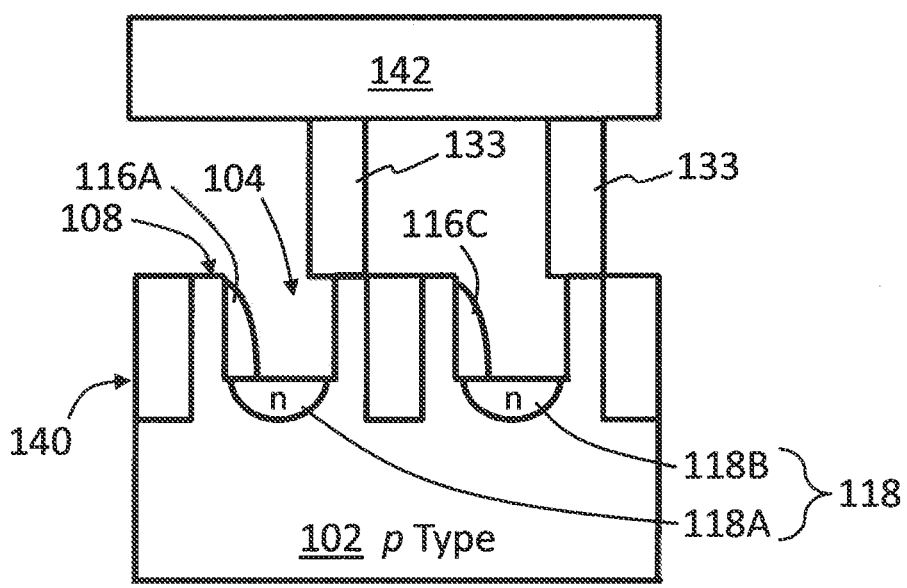

Referring now to FIG. 3D, which shows the cross section view of the substrate contacts 133 disposed on top of the trench sidewalls 108 in the second stitch region 122. A respective one of a plurality of substrate lines 142 is coupled to the substrate contacts 133 along the second direction for grounding or controlling the substrate potential. The substrate contacts 132 in the first stitch region 120 have the same structure as the substrate contacts 133 in the second stitch region 122 illustrated in FIG. 3D. The substrate contacts 132 and 133 are preferably disposed on top of trench sidewall regions where the gate electrodes 116 have been severed in order to minimize the space usage of the substrate contacts 132 and 133. The substrate contacts 132 and 133 may comprise any suitable conductive material, such as tungsten silicide (WSi$_x$), titanium silicide (TiSi$_x$), cobalt silicide (CoSi$_x$), nickel silicide (NiSi$_x$), tantalum nitride (TaN$_x$), titanium nitride (TiN$_x$), tantalum (Ta), tungsten (W), titanium (Ti), palladium (Pd), platinum silicide (PtSi), Indium (In), or combinations thereof. The substrate contacts 132 and 133 may be fabricated using a conventional damascene process in a manner as well known to one of skill in the art after the formation of the memory elements 134 or the source lines 118.

Figures 4A, 4B:
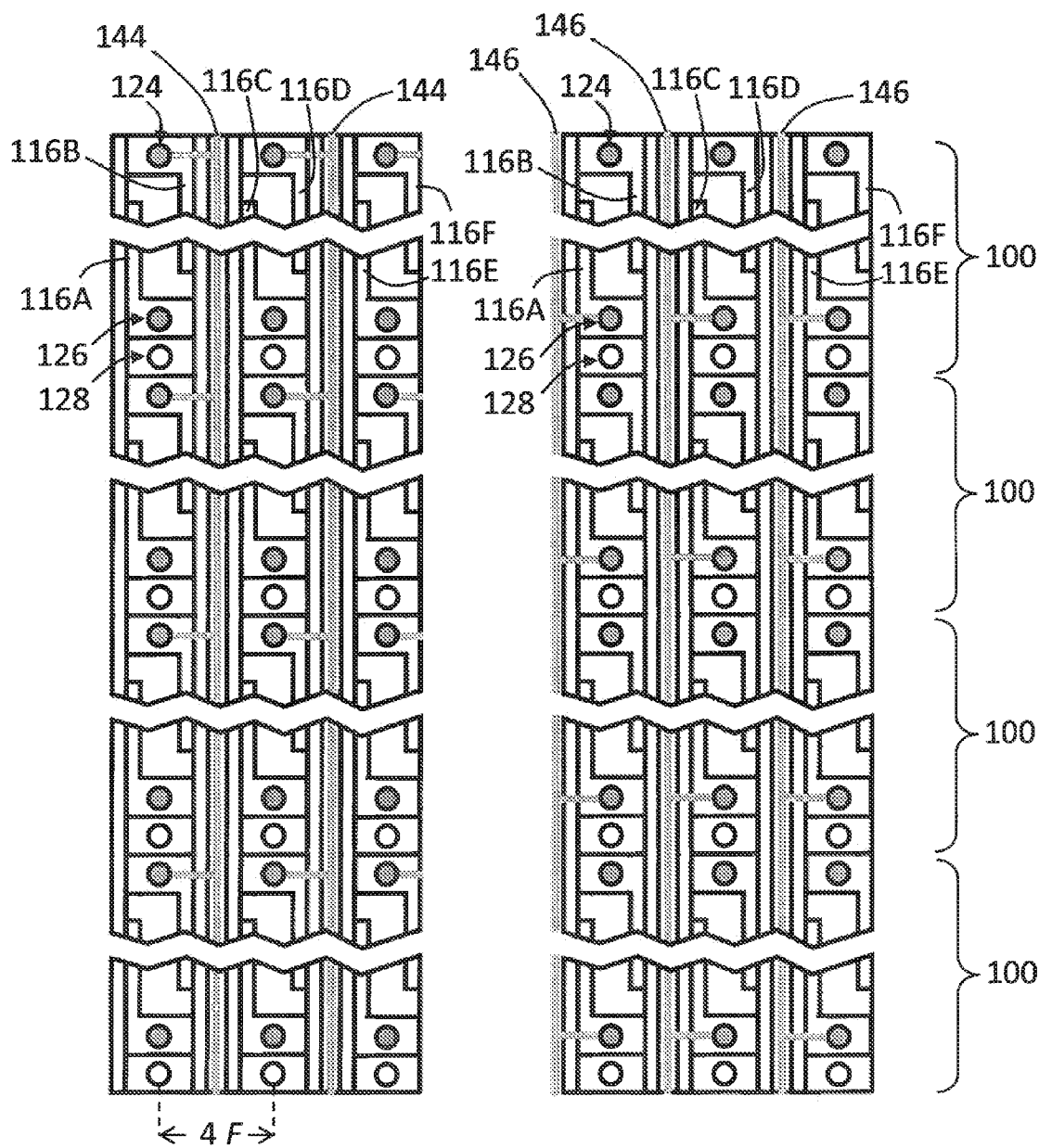
FIGS. 4A and 4B are top views corresponding to two levels of a memory device comprising a plurality of memory arrays coupled to two sets of word lines in accordance to an embodiment of the present invention.

A memory device may comprise one or more of the memory arrays 100 coupled to common sets of word lines and source lines. FIGS. 4A and 4B illustrate an exemplary device having multiple memory arrays 100 coupled to two sets of word lines 144 and 146 extending along the first direction substantially parallel to the trenches on two separate levels above the memory cells. For reasons of brevity and clarity, the individual memory arrays 100 are not drawn to scale and only the stitch regions and components therein are shown. The gate contacts 124 and 126 are raised above memory cells and are spaced apart with a pitch of 4 F in the second direction perpendicular to the first direction for a memory cell size of 4 F$^2$. Referring now to FIG. 4A, on the first level the first set of parallel word lines 144 extending along the trench direction are coupled to the gate contacts 124, which are connected to the gate electrodes 116B, 116D, and 116F formed on the right trench sidewalls. FIG. 4B shows the second set of parallel word lines 146 on the second level coupling to the gate contacts 126, which are connected to the gate electrodes 116A, 116C, and 116E formed on the left trench sidewalls. Therefore, one of each pair of the gate electrodes 116 formed on a respective pair of the trench sidewalls is connected to a respective one of the first set of word lines 144 and the other one of each pair of the gate electrodes 116 is connected to a respective one of the second set of word lines 146.

It should be noted that one of each pair of the gate electrodes 116 formed on a respective pair of the trench sidewalls is coupled to a respective one of the first row of gate contacts 124 and the other one of each pair of the gate electrodes 116 formed on a respective pair of the trench sidewalls is coupled to a respective one of the second row of gate contacts 126. Hence, the scheme for connecting the gates electrodes 116 to the gate contacts 124 and 126 shown in FIGS. 4A and 4B may be altered as mentioned afore, which could alter the connection scheme for coupling the gate contacts 124 and 126 to the word lines 144 and 146.

Figures 5A, 5B:
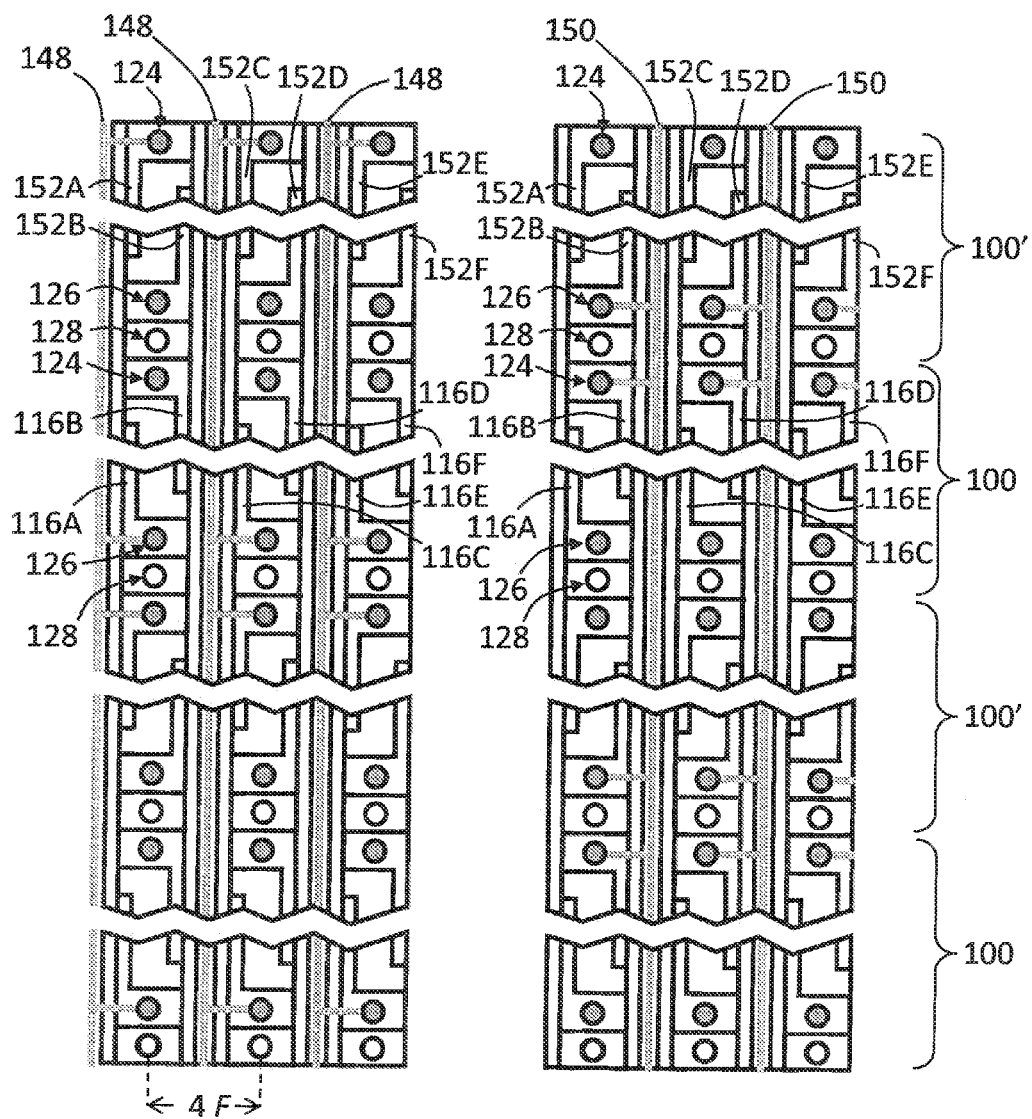
FIGS. 5A and 5B are top views corresponding to two levels of a memory device comprising a plurality of memory arrays coupled to two sets of word lines in accordance to another embodiment of the present invention.

FIGS. 5A and 5B show another memory device comprising different variants of memory arrays 100 and 100' coupled to two sets of parallel word lines 148 and 150 on two separate levels. In contrast to the memory array 100 (henceforth referred to as Type A), the memory array 100' (henceforth referred to as Type B) has an opposite scheme for connecting the gate electrodes 152 to the gate contacts 124 and 126, wherein the gate electrodes 152A, 152C, and 152E formed on the left trench sidewalls are coupled to the first gate contacts 124 and the gate electrodes 152B, 152D, and 152F formed on the right trench sidewalls are coupled to the second gate contacts 126. FIG. 5A shows the first set of parallel word lines 148 coupled to the first contacts 124 in Type B array 100' and to the second contacts 126 in Type A array 100, which are connected to the gates electrodes formed on the left trench sidewalls. FIG. 5B shows the second set of parallel word lines 150 coupled to the second contacts 126 in Type B array 100' and to the first contacts 124 in Type A array 100, which are connected to the gates electrodes formed on the right trench sidewalls. The current device comprises a plurality of Type A arrays 100 and Type B arrays 100' stitched together in an order of ABABAB. The present word line stitching scheme wherein one of each pair of the gate electrodes formed on a respective pair of the trench sidewalls is connected to a respective one of the first set of word lines and the other one of each pair of the gate electrodes is connected to a respective one of the second set of word lines can be applied to all memory array combinations, such as AAAAAA (FIGS. 4A and 4B), ABABAB (FIGS. 5A and 5B), BBBBBB, AABABB, and so forth.

Figure 6:
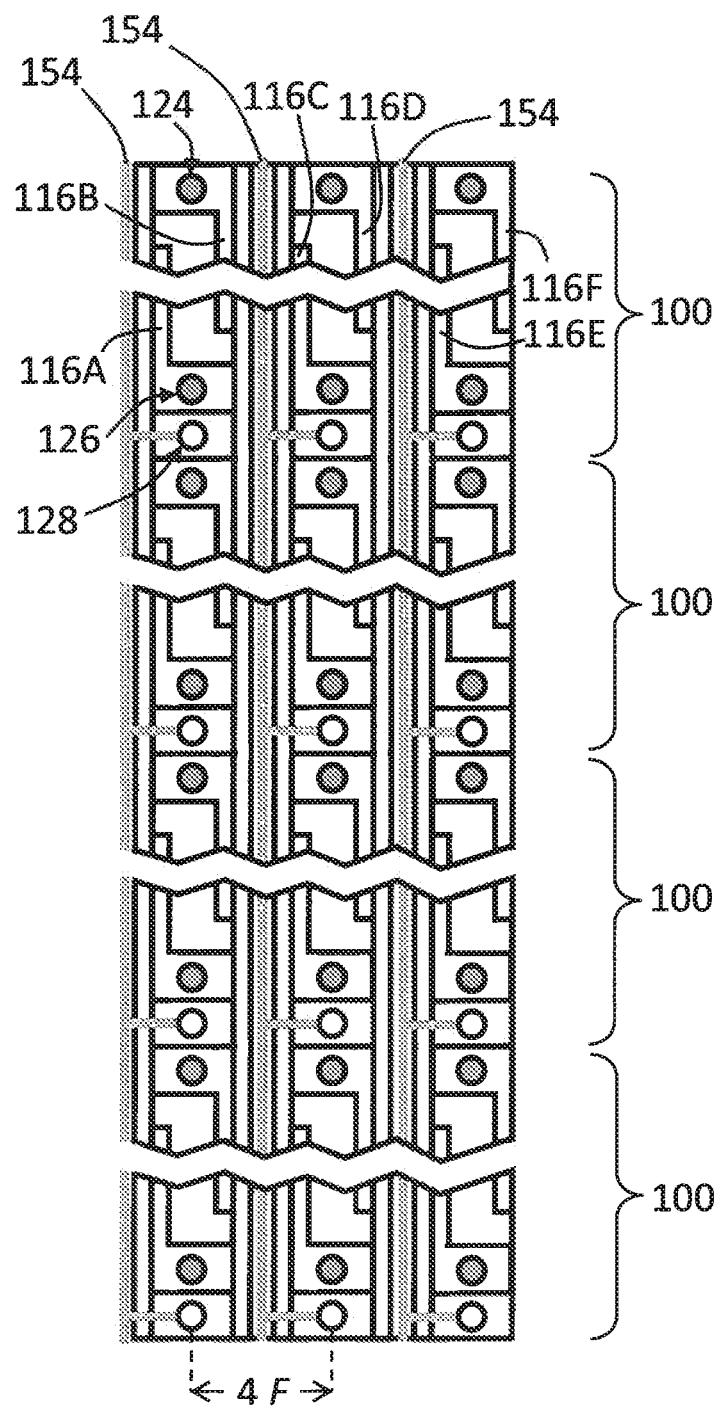
FIG. 6 is a top view of a memory device comprising a plurality of parallel source lines coupled to source contacts in accordance to an embodiment of the present invention.

FIG. 6 illustrates the source contacts 128 of the memory device of FIGS. 4A and 4B (Type A array) coupling to a set of parallel source lines 154 extending in the trench direction on a separate level from the two sets of word lines 148 and 150. A row of the source contacts 128 disposed in a respective one of the trenches are coupled to a respective one of the source lines 154. It should be recognized that the present scheme for coupling the source contacts 128 to the source lines 154 may be extended to all memory array combinations, such as ABABAB, BBBBBB, AABAAB, and so forth.

The memory cells 112 of the memory array 100 illustrated in FIG. 2 may be arranged to have a pitch 2 F in the second direction perpendicular to the trenches, resulting in the first gate contacts 124, the second gate contacts 126, and the source contacts 128 to have a pitch of 4 F in the same direction as shown in FIGS. 4A-6. The contacts 124-128 are raised above the memory cells 112 for connecting to the first and second set of word lines 144-150 and the source lines 154 at the metal levels, where metallic interconnecting wires are formed. The source lines 154 and the two sets of the word lines 144-150 are formed at three separate metal levels. At each level, the source lines 154 or one of the two sets of the word lines 144-150 extend along the first direction in between the contacts 124-128, which are spaced apart in the second direction with a pitch of 4 F. The word lines 144-150 and the source lines 154 may comprise any suitable conductive material, such as copper (Cu), tungsten (W), aluminum (Al), silver (Ag), or alloys thereof and may be fabricated using a conventional damascene process in a manner as well known to one of skill in the art.

While the present invention has been shown and described with reference to certain preferred embodiments, it is to be understood that those skilled in the art will no doubt devise certain alterations and modifications thereto which nevertheless include the true spirit and scope of the present invention.

Thus the scope of the invention should be determined by the appended claims and their legal equivalents, rather than by examples given.

What is claimed is:

1. A memory device comprising:
    a plurality of memory arrays formed along a first direction, each of said memory arrays including:
        a memory region comprising an array of memory cells arranged in an array with a pitch of 2 F in a second direction substantially perpendicular to said first direction; and
        a first and a second stitch region disposed adjacent said memory region along said first direction having a first and second row of gate contacts disposed therein, respectively, said first and second row of gate contacts being arranged along said second direction with a pitch of 4 F, each of said first and second row of gate contacts being connected to a respective row of said memory cells along said first direction; and
    a first and second plurality of word lines extending along said first direction,
    wherein each row of said first and second row of gate contacts of each of said memory arrays are coupled to said first or second plurality of word lines.

2. A memory device comprising:
    a semiconductor substrate having a plurality of parallel trenches therein extending along a first direction, each of said trenches having a respective pair of a plurality of paired trench sidewalls;
    a memory region formed in said semiconductor substrate, said memory region including an array of memory cells;
    a plurality of paired gate electrodes formed on said paired trench sidewalls, said gate electrodes coupled to said memory cells along said first direction; and
    a first and a second stitch region disposed adjacent said memory region along said first direction including a first and a second row of gate contacts, respectively, formed in said trenches along a second direction substantially orthogonal to said first direction,
    wherein one of each pair of said gate electrodes is coupled to a respective one of said first row of gate contacts disposed in a respective one of said trenches and the other one of each pair of said gate electrodes is coupled to a respective one of said second row of gate contacts disposed in said respective one of said trenches.

3. The memory device according to claim 2, wherein each of said trenches has a respective one of said first row of gate contacts and a respective one of said second row of gate contacts disposed therein.

4. The memory device according to claim 2, wherein said semiconductor substrate comprises silicon.

5. The memory device according to claim 2, wherein said semiconductor substrate has a p-type conductivity.

6. The memory device according to claim 2, wherein said buried source electrodes have an n-type conductivity.

7. The memory device according to claim 2, wherein said memory cells in said memory region are arranged in a square array with a pitch of 2 F in said first and said second direction.

8. The memory device according to claim 2, wherein said first row of gate contacts and said second row of gate contacts are arranged to have a pitch of 4 F in said second direction.

9. The memory device according to claim 2, further comprising:
    a first and a second plurality of substrates contacts coupled to said substrate in said first and said second stitch region, respectively; and
    a plurality of parallel substrate lines coupled to said first and said second plurality of substrate contacts along said second direction.

10. The memory device according to claim 9, wherein said first and said second plurality of substrate contacts are disposed on top of trench sidewall regions where said gate electrodes have been severed.

* * * * *